United States Patent
Song et al.

(10) Patent No.: US 7,283,393 B2
(45) Date of Patent: Oct. 16, 2007

(54) NAND FLASH MEMORY DEVICE AND METHOD OF FABRICATING THE SAME

(75) Inventors: Jai-Hyuk Song, Seoul (KR); Jeong-Hyuk Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/483,466

(22) Filed: Jul. 10, 2006

(65) Prior Publication Data
US 2007/0012979 A1    Jan. 18, 2007

(30) Foreign Application Priority Data
Jul. 12, 2005    (KR) .................... 10-2005-0062792

(51) Int. Cl.
*G11C 11/34*    (2006.01)
(52) U.S. Cl. ................... 365/185.17; 257/200
(58) Field of Classification Search ........... 365/185.17; 257/200
See application file for complete search history.

(56) References Cited

U.S. PATENT DOCUMENTS

| | | | | |
|---|---|---|---|---|
| 5,587,948 A * | 12/1996 | Nakai | ..................... | 365/185.17 |
| 6,329,247 B1 | 12/2001 | Ito | | |
| 6,996,011 B2 * | 2/2006 | Yeh et al. | ............... | 365/185.26 |
| 2004/0157394 A1 | 8/2004 | Iwai et al. | | |
| 2005/0207225 A1 * | 9/2005 | Chen et al. | ............. | 365/185.17 |
| 2005/0232012 A1 * | 10/2005 | Park | ....................... | 365/185.17 |
| 2005/0276105 A1 * | 12/2005 | Yeh et al. | ............... | 365/185.17 |
| 2007/0121380 A1 * | 5/2007 | Thomas | .................. | 365/185.17 |

FOREIGN PATENT DOCUMENTS

| | | |
|---|---|---|
| JP | 2001 044395 | 2/2001 |
| JP | 2003 092368 | 3/2003 |
| KR | 1999 015794 | 3/1999 |
| KR | 2001 0030002 | 4/2001 |

OTHER PUBLICATIONS

English Abstract for Publication No. 1999-015794.
English Abstract for Publication No. 2001-044395.
English Abstract for Publication No. 1020010030002.
English Abstract for Publication No. 2003-092368.

* cited by examiner

*Primary Examiner*—Michael T Tran
(74) *Attorney, Agent, or Firm*—F. Chau & Associates, LLC

(57) ABSTRACT

A NAND type flash memory device includes a semiconductor substrate, word lines, first and second selection lines, tunnel insulation layers, and selection gate insulation layers. The semiconductor substrate includes a memory transistor region and a selection transistor region. The word lines are arranged in the memory transistor region of the semiconductor substrate, and the selection lines are arranged in the selection transistor region of the semiconductor substrate. The tunnel insulation layers are interposed between the word lines and the semiconductor substrate, and the selection gate insulation layers are interposed between the selection lines and the semiconductor substrate and have a thinner thickness than the thickness of the tunnel insulation layers. Also, the selection gate insulation layers have a thinner thickness in their center region than in their edge portions.

20 Claims, 7 Drawing Sheets

NAND FLASH MEMORY DEVICE AND METHOD OF FABRICATING THE SAME

CROSS-REFERENCE TO RELATED APPLICATION

This application claims priority to Korean Patent Application No. 10-2005-0062792, filed on Jul. 12, 2005, the disclosure of which is hereby incorporated by reference herein in its entirety.

BACKGROUND OF THE INVENTION

1. Technical Field

The present disclosure relates to a semiconductor device and a fabrication method thereof, and more particularly, to a not-and (NAND) flash memory device and a fabrication method thereof.

2. Description of the Related Art

A flash memory device is a kind of non-volatile memory devices maintaining stored information regardless of whether or not power is supplied to the device. Unlike a read only memory (ROM), which is another kind of a non-volatile memory device, the flash memory device has a characteristic of electrically changing stored information rapidly and easily.

The flash memory device can be classified into, for example, a NOR-type flash memory device and a NAND-type flash memory device depending upon the structure in which memory cells are connected to bit lines and ground electrodes. For example, the NOR-type flash memory device (referred to as a NOR flash memory) has a structure in which memory cells are connected in parallel to one another between the bit lines and the ground electrodes, achieving rapid random access. Therefore, the NOR flash are widely used for example, for basic input output system (BIOS), cellular phones, and personal digital assistants (PDAs).

On the other hand, the NAND-type flash memory device (referred to as a NAND flash memory) has a structure in which memory cells are connected in series between bit lines and ground electrodes (refer to FIG. 1). For example, a cell array 100 of the NAND flash memory includes a plurality of cell strings 10, and each cell string 10 includes a plurality of memory cells that are connected in series. At this point, ground selection transistors connected by ground selection lines GSL and string selection transistors connected by string selection lines SSL are arranged at both ends of the cell strings 10, to control the electrical connection between the memory cells and the bit lines 40/ground electrodes 45.

The NAND flash memory device has the highest integration among available semiconductor devices due to its series connection structure. Also, as the NAND flash memory device uses an operational method of simultaneously changing information stored in a plurality of memory cells, the information updating speed of the NAND flash memory device is significantly greater than that of the NOR flash memory device. With such a high integration and rapid updating speed, the NAND flash memory device is widely used for portable electronic products that require mass storage such as, for example, digital cameras and MP3 players. Moreover, it is expected that the market for NAND flash products will expand even further due to the rapidly increasing demand for portable electronic products.

As well known in the art, NAND flash memory devices update information stored in selected memory cells using Fowler-Nordheim tunneling, and this information updating operation (e.g., programming and erasing operations) is simultaneously performed on a page or block consisting of a plurality of memory cells as described above. At this point, a programming operation by a page unit may cause a difficulty in that an unselected memory cell (particularly, a memory cell adjacent to a selected memory cell) located along a selected word line WL may be programmed. This inadvertent programming of an unselected memory cell is generally called "program disturbance".

To prevent such program disturbance, the programming operation of the NAND flash memory is performed using self-boosting scheme, which is described in U.S. Pat. No. 5,677,873 titled "METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN" and U.S. Pat. No. 5,991,202 titled "METHOD FOR REDUCING PROGRAM DISTURB DURING SELF-BOOSTING IN A NAND FLASH MEMORY".

The above-mentioned self-boosting scheme controls the voltage applied to gate electrodes of string selection lines SSL and ground selection lines GSL such that an unselected cell string is not electrically connected to a bit line 40 and a ground electrode 45 connected to the unselected cell string. When the cell string 10 is electrically isolated, the voltage applied to a portion of a substrate 1 located under unselected memory cells is raised up to a predetermined voltage by a program voltage applied to a selected word line WL (refer to FIG. 2). The above-mentioned voltage rise is called boosting. Moreover, when the voltage of the substrate is raised, the potential difference between a floating gate electrode 22 and the substrate 1 is reduced, thereby cutting off Fowler-Nordheim tunneling through a tunnel insulation layer 70. Consequently, the above-described program disturbance is prevented.

With the above-described mechanism of self-boosting scheme, an unselected cell string should be completely isolated from the bit line 40 and the ground electrode 45 to prevent the program disturbance. In addition, to achieve the electrical isolation of the cell string 10, the turn-off current characteristic for the string selection transistor and the ground selection transistor should be improved. However, according to a conventional art, as the gate insulation layer 75 of the selection transistors is formed with the same thickness as the thickness of the tunnel insulation layer 70 of memory cell transistors as illustrated in FIG. 2, there thus may be limitations in being able to improve the turn-off current characteristics of selection transistors. For example, with conventional NAND flash memory devices, reducing the linewidth of the selection transistor for increasing integration may cause a short-channel effect, thereby reducing the turn-off current characteristic of the selection transistor.

Thus, there is a need for NAND flash memory devices which prevent program disturbance and which include selection transistors having improved turn-off current characteristics and for methods of fabricating the same.

SUMMARY OF THE INVENTION

In accordance with an exemplary embodiment of the present invention, a NAND flash memory device is provided. The NAND flash memory device includes a semiconductor substrate including a memory transistor region and a selection transistor region, word lines arranged in the memory transistor region of the semiconductor substrate, selection lines arranged in the selection transistor region of the semiconductor substrate, tunnel insulation layers interposed between the word lines and the semiconductor substrate and selection gate insulation layers interposed between the selection lines and the semiconductor substrate. The selection gate insulation layers are thinner than the tunnel insulation layers, and the selection gate insulation layers have a thinner thickness in their center region than in their edge portions.

In other exemplary embodiments, the selection lines may have a wider width than that of the word lines. Also, the width of the first and second selection lines may be at least twice the distance between the position where the thickness of the selection gate insulation layers is equal to the thinnest thickness of the tunnel insulation layers and a sidewall of the selection lines.

In accordance with an exemplary embodiment of the present invention, a NAND flash memory device is provided. The NAND flash memory device includes a semiconductor substrate including a memory transistor region, a selection transistor region, and a low voltage transistor region, word lines arranged in the memory transistor region of the semiconductor substrate, selection lines arranged in the selection transistor region of the semiconductor substrate, low voltage gate electrodes arranged in the low voltage transistor region of the semiconductor substrate, tunnel insulation layers interposed between the word lines and the semiconductor substrates, selection gate insulation layers interposed between the selection lines and the semiconductor substrate and low voltage gate insulation layers interposed between the low voltage gate electrodes and the semiconductor substrate. The selection gate insulation layers are thinner than the tunnel insulation layers.

In other exemplary embodiments, the selection gate insulation layers may have the same thickness as that of the low voltage gate insulation layers. Also, the word lines may have a narrower width than that of the low voltage gate electrodes. In addition, the selection gate insulation layers may have a thinner thickness in their center rather than in their edge portions.

In other exemplary embodiments, the width of the first and second selection lines may be at least twice the distance between the position where the thickness of the selection gate insulation layers is equal to the thinnest thickness of the tunnel insulation layers and a sidewall of the first and second selection lines and the width of the low voltage gate electrodes is at least twice the distance between the position where the thickness of the low voltage gate insulation layer is equal to the thinnest thickness of the tunnel insulation layers and a sidewall of the low voltage gate electrodes.

Exemplary embodiments of the present invention provide a method for fabricating a NAND flash memory device and the method includes forming selection gate insulation layers thinner than tunnel insulation layers.

In accordance with exemplary embodiments of the present invention a method for fabricating a NAND flash memory device is provided. The method includes forming a device isolation layer pattern to define active regions in a semiconductor substrate including a memory transistor region, a selection transistor region, and a low voltage transistor region, forming a first insulation layer pattern covering the memory transistor region on the active regions, forming a second insulation layer pattern on at least substantially an entire surface of the active regions where the first insulation layer pattern is formed, and forming word lines, selection lines and low voltage gate electrodes on the second insulation layer and wherein the word lines, selection lines and low voltage gate electrodes are located over the memory transistor region, the selection transistor region and the low voltage transistor region, respectively.

The forming of the first insulation layer pattern may include: forming a first insulation layer on an entire surface of the active regions, forming a mask pattern located on an upper surface of the memory transistor region on the first insulation layer; etching the first insulation layer using the mask pattern for an etch mask to expose an upper surface of the active regions from the selection transistor region and low voltage transistor region and removing the mask pattern.

The forming of the second insulation layer may be performed such that sum of the thickness of the first insulation layer pattern and the thickness of the second insulation layer stacked on an upper surface of the memory transistor region is greater than the thickness of the second insulation layer stacked on an upper surface of the selection transistor region and the low voltage transistor region.

In accordance with exemplary embodiments of the present invention, a method for fabricating a NAND flash memory device is provided. The method includes forming a device isolation layer pattern to define active regions on a semiconductor substrate including a memory transistor region, a selection transistor region, and a low voltage transistor region, forming a gate oxide layer having a first thickness on at least substantially an entire surface of the active regions, forming word lines, selection lines, and low voltage gate electrodes on the gate oxide layer, and wherein the word lines, the selection lines and the low voltage gate electrodes are located over the memory transistor region, the selection transistor region and the low voltage transistor region, respectively. The method further includes performing a thermal oxidation process until the gate oxide layer becomes a second thickness under a central portion of the word lines. Moreover, the selection lines are formed with a wider width than a width of the word lines such that the gate oxide layer formed under a central portion of the selection lines has a thinner thickness than the second thickness during the thermal oxidation process.

BRIEF DESCRIPTION OF THE DRAWINGS

Exemplary embodiments of the present invention can be understood in more detail from the following description taken in conjunction with the accompanying drawings in which.

DETAILED DESCRIPTION OF THE EXEMPLARY EMBODIMENTS

Reference will now be made in detail to the exemplary embodiments of the present invention, examples of which are illustrated in the accompanying drawings. However, the present invention is not limited to the exemplary embodiments illustrated herein after.

FIGS. 3A to 3F are cross-sectional views illustrating a method for fabricating a NAND type flash memory device according to an exemplary embodiment of the present invention.

Figure 1:
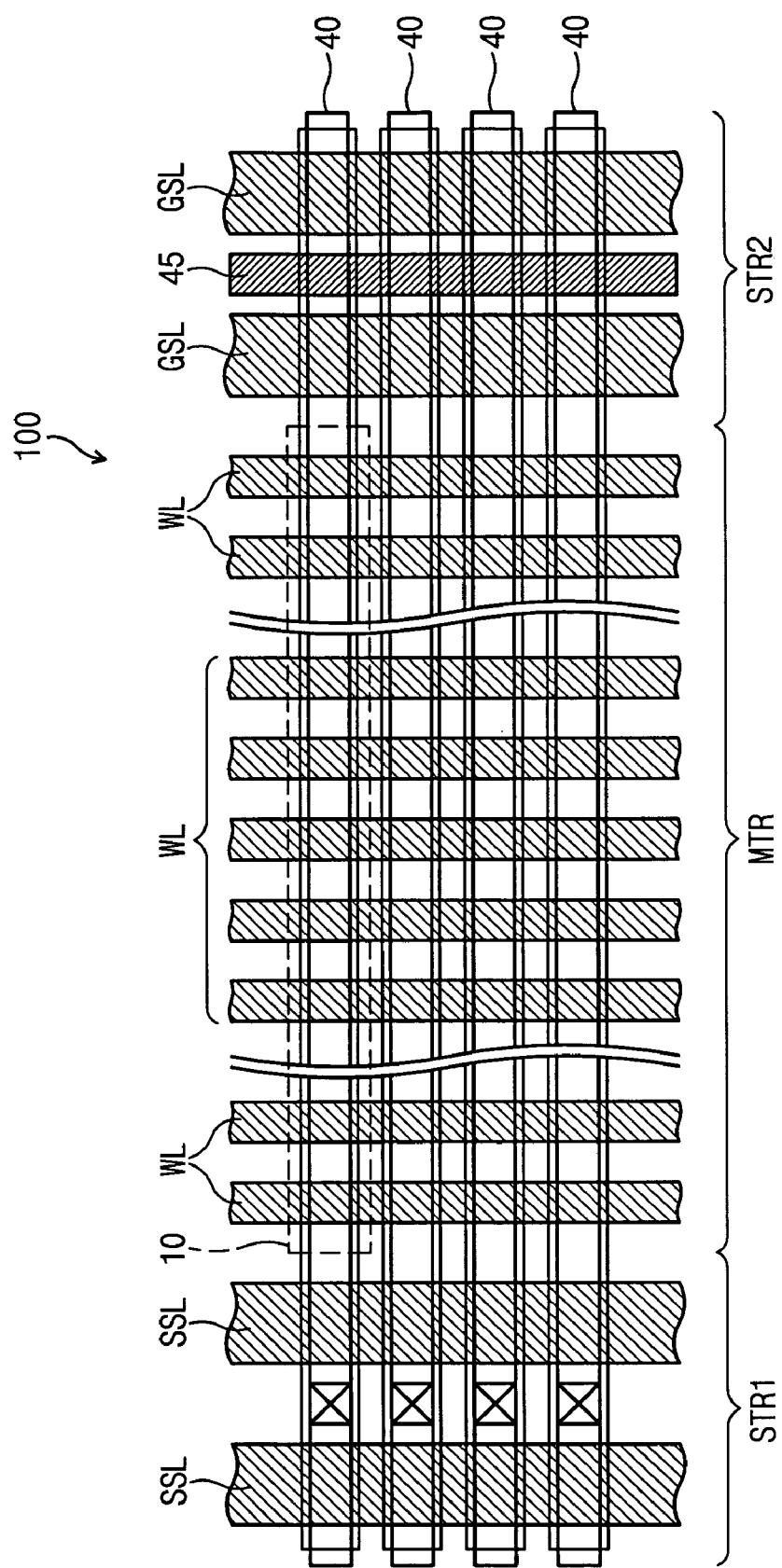
FIG. 1 is a plan view illustrating a portion of a cell array of a general NAND type flash memory device.
Figure 2:
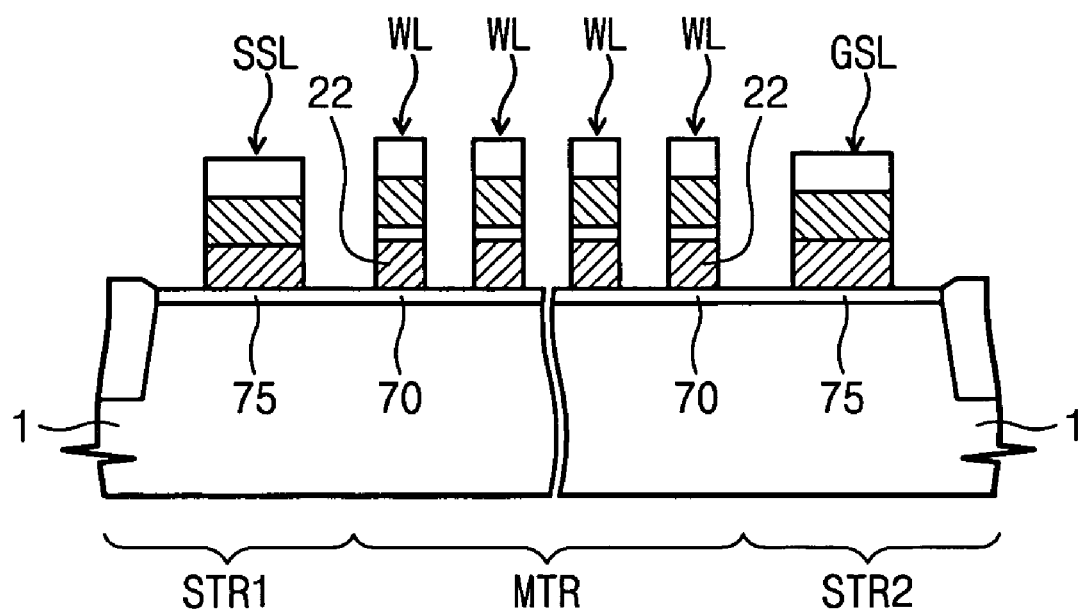
FIG. 2 is a cross-sectional view of a process for a cell array of NAND type flash memory device according to a conventional art.
Figure 3A:
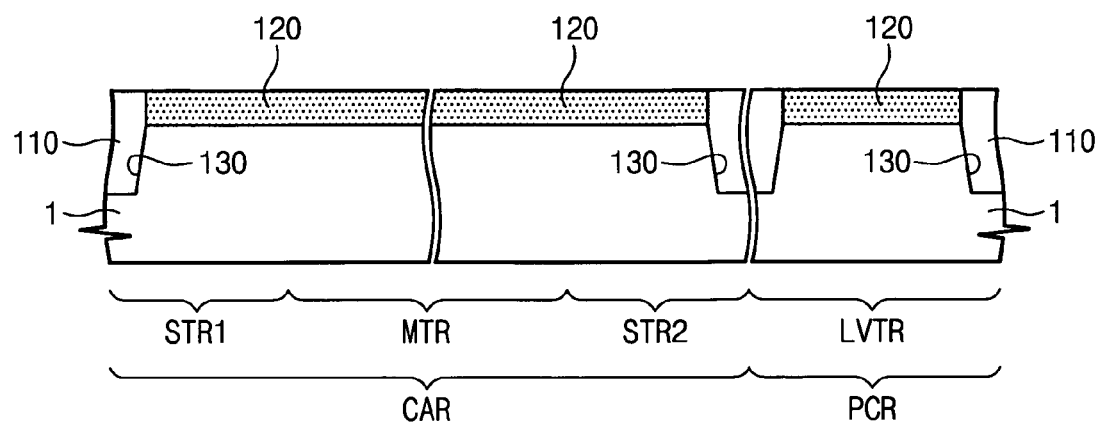
FIGS. 3A to 3F are cross-sectional views illustrating a method for fabricating a NAND type flash memory device according to an exemplary embodiment of the present invention.

Referring to FIG. 3A, a device isolation pattern 110 limiting active regions is formed in a predetermined region of the semiconductor substrate 1. The semiconductor substrate 1 includes a cell array region CAR and a peripheral circuit region PCR. The CAR includes a memory transistor region MTR and a selection transistor region STR1 and STR2. The PCR includes a low voltage transistor region LVTR and a high voltage transistor region.

The forming of the device isolation layer pattern 110 includes forming a trench mask pattern 120 for defining the active regions on the semiconductor substrate 1 and anisotropy etching on the semiconductor substrate 1 using the trench mask pattern 120 for an etch mask to form trenches 130. The trench mask pattern 120 may include a pad oxide layer, a trench lower mask layer, and a trench upper mask layer sequentially stacked. At this point, the trench lower mask layer may be formed of polysilicon, and the trench upper mask layer may be a silicon nitride layer. After the trenches 130 are formed, a predetermined ion implantation process is performed to reinforce an insulation characteristic, and a thermal oxidation layer is formed at a thickness of about 50 angstroms (Å) on an inner wall of the trenches 130. Subsequently, after a device isolation insulation layer for filling the trenches 130 is formed, planarization etching is performed on the device isolation insulation layer until the trench mask pattern 120 is exposed, so that the device isolation layer pattern 110 is formed.

Figure 3B:
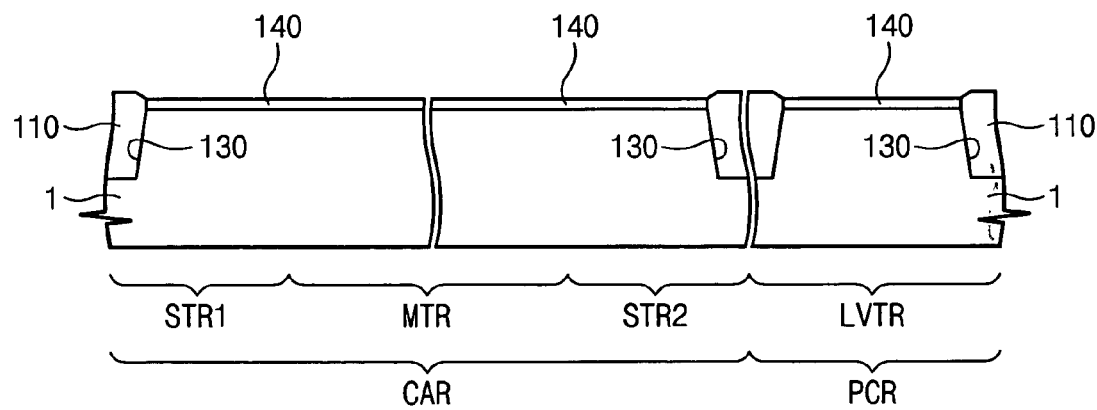

Referring to FIG. 3B, the trench mask pattern 120 is removed using wet etching, so that an upper surface of the active regions is exposed. Subsequently, a first insulation layer 140 is formed on an upper surface of the exposed active regions. The first insulation layer 140 has a constant thickness in a range of about 10-60 Å over the memory transistor region MTR, selection transistor regions STR1, STR2, and low voltage transistor region LVTR.

The first insulation layer 140 may be formed of, for example one material selected from the group consisting of a silicon oxide, a silicon nitride, a silicon oxynitride, $Al_2O_3$, $Al_xSi_yO_z$, $(Ba,Sr)TiO_3$, $BeAl_2O_4$, $CeO_2$, $CeHfO_4$, $CoTiO_3$, $Si_3N_4$, $EuAlO_3$, $HfO_2$, Hf silicate, $La_2O_3$, $LaAlO_3$, $LaScO_3$, $La_2SiO_5$, $MaAl_2O_4$, $NdAlO_3$, $PrAlO_3$, $SmAlO_3$, $SrTiO_3$, $Ta_2O_5$, $TiO_2$, $Y_2O_3$, $Y_xSi_yO_z$, $ZrO_2$, Zr silicate, Zr—Al—O, and $(Zr,Sn)TiO_4$. According to an exemplary embodiment of the present invention, the first insulation layer 140 is a silicon oxide layer formed using a thermal oxidation process. In the case where the first insulation layer 140 is a silicon oxide layer, the forming of the first insulation layer 140 may be performed using the thermal oxidation process. In the case where the first insulation layer 140 is a layer which is not a silicon oxide layer, the forming of the first insulation layer 140 may be performed using a deposition process.

Figure 3C:
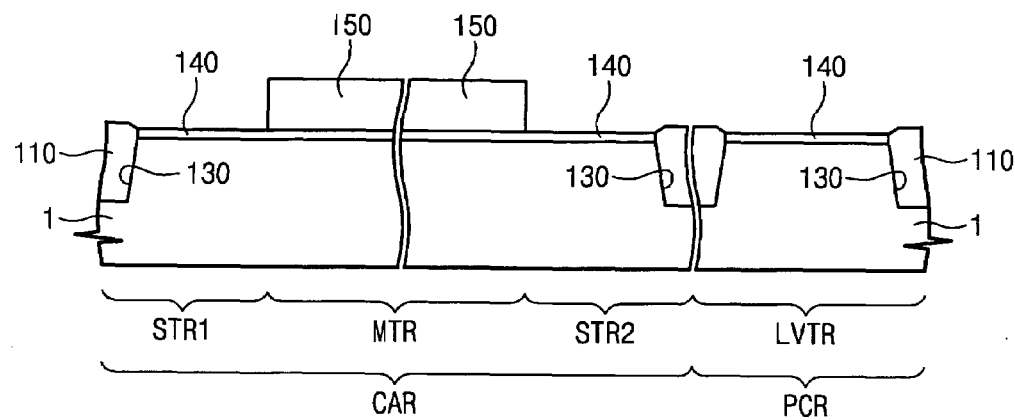

Referring to FIG. 3C, a mask pattern 150 is formed on the memory transistor region MTR. The mask pattern 150 exposes an upper surface of the first insulation layer 140 in the selection transistor regions STR1 and STR2 and low voltage transistor region LVTR.

The mask pattern 150 may be a photoresist pattern. The forming of the mask pattern 150 includes forming a photoresist layer on the first insulation layer 140 and performing an exposure and development processes. The mask pattern 150 may further include a protection layer interposed between the photoresist pattern and the first insulation layer 140. The protection layer has etching selectivity with respect to the first insulation layer 140. At this point, when mentioning that "a layer A has etching selectivity with respect to a layer B" this means that an etching process wherein an etching speed of the layer B is sufficiently large in comparison to that of the layer A can be realized.

Figure 3D:
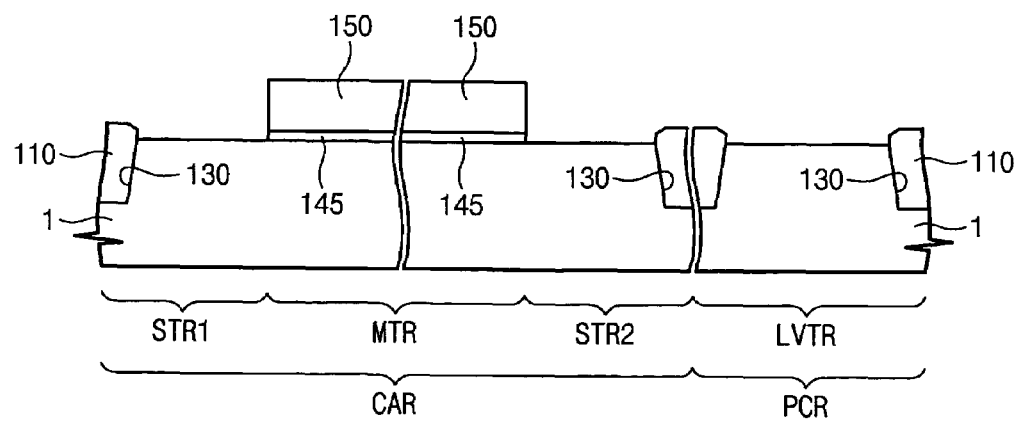

Referring to FIG. 3D, the exposed first insulation layer 140 is etched using the mask pattern 150 for an etch mask. Accordingly, the first insulation layer pattern 145 is formed to expose an upper surface of the active regions in the selection transistor regions STR1, STR2, and low voltage transistor region LVTR. That is, the first insulation layer pattern 145 is located in the memory transistor region MTR.

The etching of the first insulation layer 140 is performed using etching recipe having etching selectivity with respect to the semiconductor substrate 1. Also, for minimizing the etching damage to the semiconductor substrate 1, the etching of the semiconductor substrate 1 is performed using wet etching. In the case where the first insulation layer 140 is formed using a silicon oxide layer, an etching solution containing HF may be used for etching the first insulation layer 140.

Figure 3E:
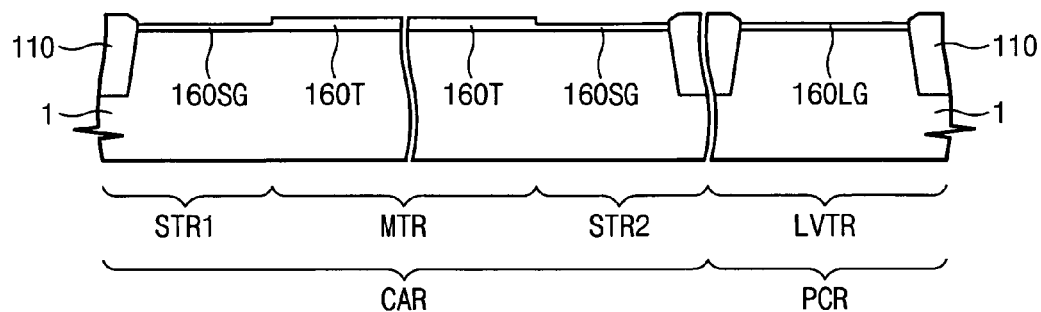

Referring to FIG. 3E, the mask pattern 150 is removed to expose an upper surface of the first insulation layer pattern 145 in the memory transistor region MTR. As the first insulation layer pattern 145 is used as a gate insulation layer (e.g., a tunnel insulation layer) of a memory transistor through a subsequent process, the physical characteristics of the first insulation layer pattern 145 have a significant influence on the electrical characteristics of the memory transistor. Considering this aspect, the removal of the mask pattern 150 should be performed such that the physical characteristics of the first insulation layer pattern 145 are not damaged.

According to an exemplary embodiment of the present invention, the mask pattern 150 is removed through a process that does not use plasma to prevent damage to the first insulation layer pattern 145. For example, in the case where the mask pattern 150 is a photoresist pattern, it is preferable that the removal of the mask pattern 150 is performed using an etching solution without plasma ashing. Also, when the mask pattern 150 includes the protection layer as described above, the photoresist pattern may include the plasma ashing, but the protection layer contacting the first insulation layer pattern 145 is removed using wet etching.

Subsequently, a second insulation layer is formed on an entire surface of a resulting material where the first insulation layer pattern 145 is formed. Therefore, only the second insulation layer is formed over the selection transistor regions STR1, STR2, and low voltage transistor region LVTR. In addition, the first insulation layer pattern 145 and the second insulation layer are stacked over the memory transistor region MTR. At this point, the first insulation layer pattern 145 and the second insulation layer stacked over the memory transistor region MTR are used as a tunnel insulation layer 160T of the memory transistor. The second insulation layer formed over the selection transistor regions STR1, STR2, and low voltage transistor region LVTR may be used as a selection gate insulation layer 160SG of the selection transistor and a low voltage gate insulation layer 160LG of the low voltage transistor. Consequently, according to exemplary embodiments of the present invention, the tunnel insulation layer 160T is thicker than the selection gate insulation layer 160SG and low voltage gate insulation layer 160LG.

The second insulation layer may be formed of the same material as that of the first insulation layer pattern 145. According to an exemplary embodiment of the present invention, both the first insulation layer pattern 145 and second insulation layer are silicon oxide layers formed through the thermal oxidation process. A stacked thickness of the second insulation layer is in a range of about 10-50 Å.

On the other hand, according to the above-described exemplary embodiments, the low voltage gate insulation layer 160LG is formed of the same thickness and same material as those of the selection gate insulation layer 160SG. Unlike this, according to other exemplary embodiments of the present invention, the low voltage gate insulation layer 160LG may be formed using a separate process. In this case, the low voltage gate insulation layer 160LG may be formed of a thickness and material different from the selection gate insulation layer 160SG.

Figure 3F:
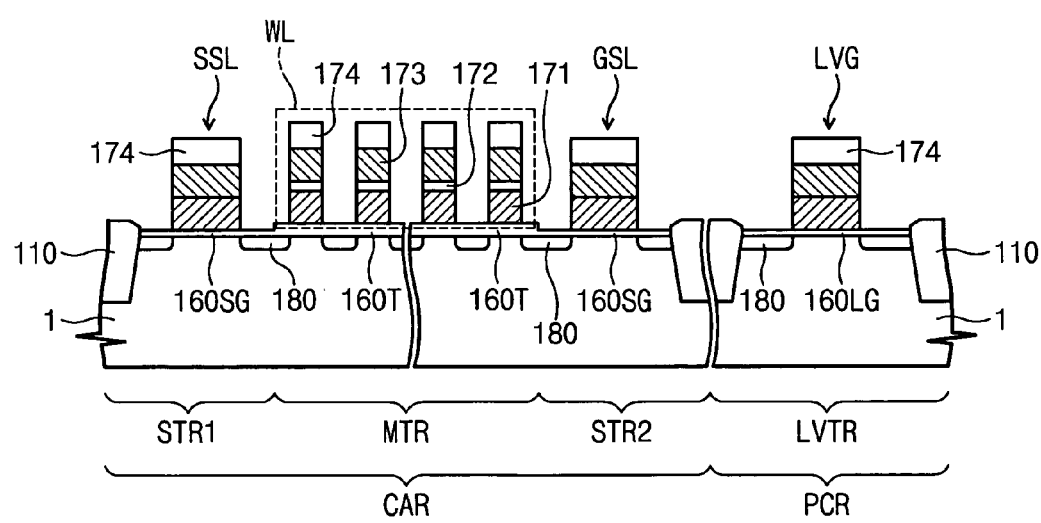

Referring to FIG. 3F, a gate structure that crosses the active regions is formed on a resulting material where the second insulation layer is formed. The gate structure includes word lines WL arranged in the memory transistor region MTR, a string selection line SSL and a ground selection line GSL arranged in the selection transistor regions STR1 and STR2, respectively, and a low voltage gate electrode LVG located in the low voltage transistor region LVTR.

The forming of the gate structure includes forming a first conductive layer on a resulting material where the second insulation layer is formed and patterning the first conductive layer to form first conductive pattern. The first conductive pattern is located over the active regions in the memory transistor region MTR. Subsequently, a gate interlayer insulation layer and a second conductive layer are formed to cover the resulting structure where the first conductive pattern is formed, and then, a gate mask pattern 174 is formed over the second conductive layer to cross the active regions. After that, the gate structure is formed by anisotropically etching the second conductive layer, the gate interlayer insulation layer and the first conductive pattern using the gate mask pattern 174 as an etch mask. At this point, though the gate mask pattern 174 may be removed, the gate mask pattern 174 may remain on the second conductive layer as illustrated.

The word lines WL formed through the above process are sequentially stacked to include a gate insulation layer pattern 172 and a control gate electrode that cross the active regions, and a floating gate electrode 171 interposed between the gate interlayer insulation layer pattern 172 and the tunnel insulation layer 160T. On the other hand, the string selection line SSL and ground selection line GSL have a structure such that the first conductive pattern and second conductive pattern are electrically connected to each other. For this purpose, openings exposing an upper surface of the first conductive pattern may be formed by etching the gate interlayer insulation layer, before forming of the second conductive layer. At this point, the openings are formed in the selection transistor regions STR1 and STR2, and may be formed in the low voltage transistor region LVTR.

On the other hand, according to other exemplary embodiments of the present invention, the selection lines SSL, GSL, and the low voltage gate electrode LVG may be one of the first conductive layer and second conductive layer. According to this exemplary embodiment, at least one of the first conductive layer, the gate interlayer insulation layer, and second conductive layer may be removed from the selection transistor regions STR1, STR2, and low voltage transistor region LVTR.

After that, ion implantation process is performed using the gate structure as an ion implantation mask to form impurity regions 180 in a portion of the active regions exposed between gate structures. On the other hand, the impurity regions 180 formed in the memory transistor region MTR, selection transistor regions STR1 and STR2, low voltage transistor region LVTR, and high voltage transistor region may have different structures and impurity concentrations.

Figure 4A:
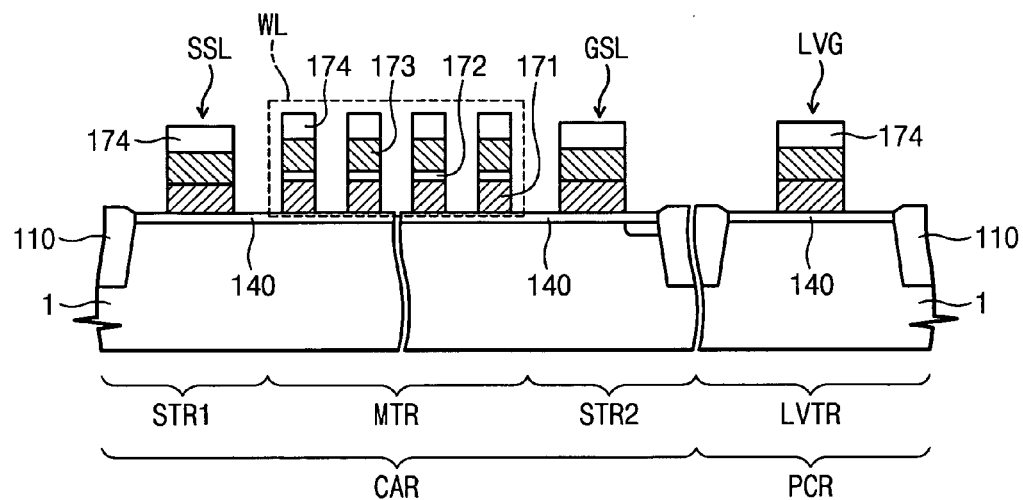
FIGS. 4A and 4B are cross-sectional views illustrating a method for fabricating a NAND type flash memory device according to an exemplary embodiment of the present invention.
Figure 4B:
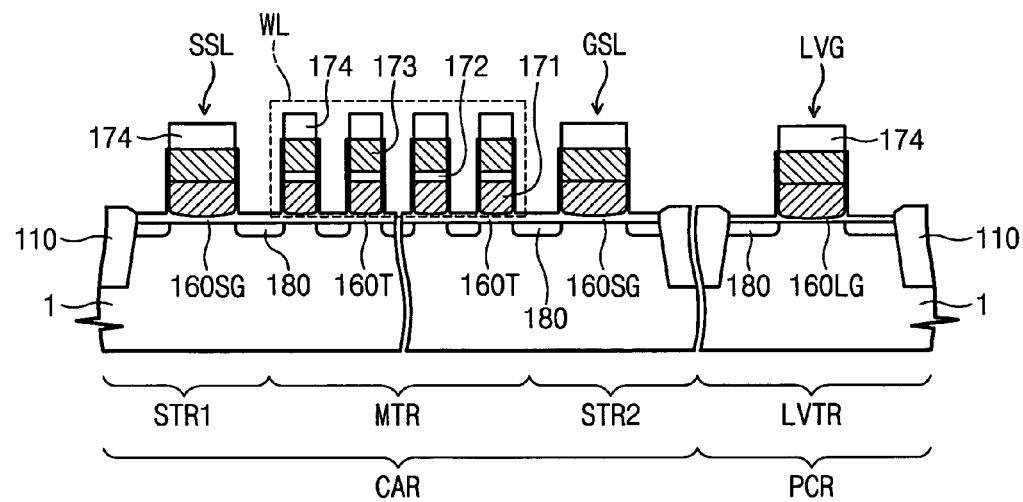

FIGS. 4A and 4B are cross-sectional views illustrating a method for fabricating a NAND type flash memory device according to another exemplary embodiment of the present invention. According to this exemplary embodiment, after the first insulation layer 140 is formed, gate structures are formed. In this respect, the present exemplary embodiment is different from the previous exemplary embodiment where the gate structure is formed after the second insulation layer is formed. Descriptions of repeated parts in the previous exemplary embodiment (that is, up to the process of forming the first insulation layer) will be omitted for convenience, and only differences will be described below.

Referring to FIGS. 4A and 4B, the gate structure is formed on a resulting material where the first insulation layer 140 is formed. According to the present exemplary embodiment, the first insulation layer 140 may be, for example, a silicon oxide layer formed through a thermal oxidation process. The process of forming the gate structure is the same as that of the previous exemplary embodiment.

According to this exemplary embodiment, the width of the selection lines SSL and GSL is formed wider than that of the word lines WL. As such a difference in the width of the lines causes a difference in a diffusion path of oxygen atoms during the thermal oxidation process, gate insulation layers formed in the lower portion also have different thicknesses.

A patterning process for forming the gate structure may cause etching damage of the active regions, tunnel insulation layer 160T, gate insulation layers 160SG and 160LG, and gate structure. In addition, the above-mentioned etching damage may reduce the electrical characteristics of the transistors. Also, the gate structure has an angled lower edge right after the patterning process is finished, but the angled lower edge of the gate structure may generate a gate induced drain leakage (GIDL) difficulty. The above-mentioned thermal oxidation process is performed to solve this difficulty.

At this point, the thermal oxidation process includes loading a semiconductor substrate where gate structures are formed, into a high temperature chamber and supplying process gases including oxygen atoms into the chamber. At this point, the oxygen gases supplied into the chamber react with silicon atoms of the gate structure and semiconductor substrate 1 to form a silicon oxide layer (that is, a second insulation layer). When this thermal oxidation layer is formed, the above-described etching damage may be prevented.

Figure 5:
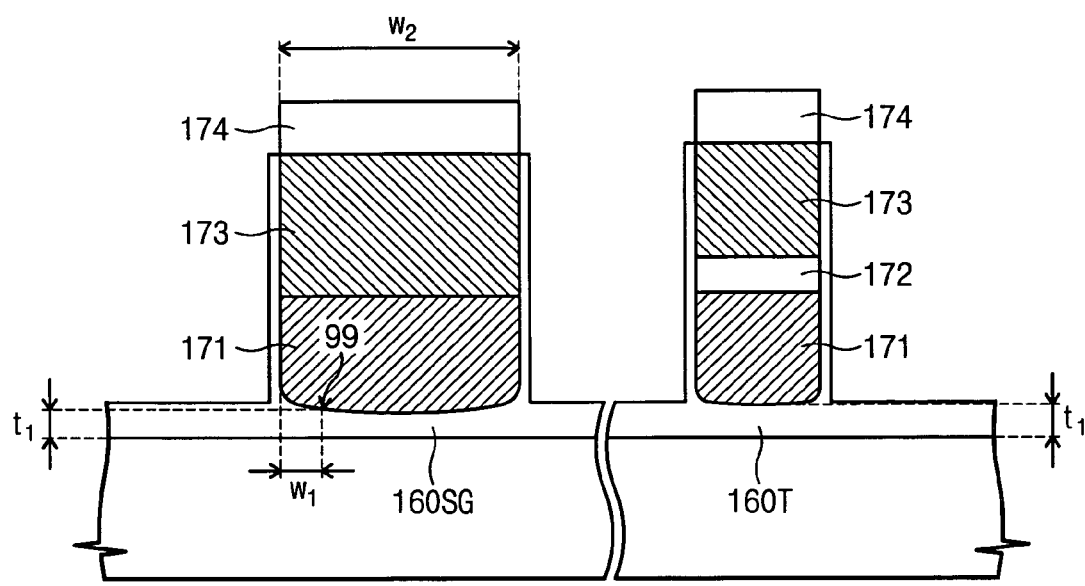
FIG. 5 is a sectional view illustrating a selection transistor and a memory transistor of a NAND type flash memory device according to an exemplary embodiment of the present invention.

On the other hand, the oxygen atoms may diffuse through the first insulation layer 140, but the length of the diffusion path is limited. That is, the number of oxygen atoms participating in an oxidation reaction is reduced as the distance from the resulting material where the first insulation layer 140 is formed increases. Also, in the case where silicon is oxidized to form a silicon oxide layer, the volume of a final silicon oxide layer expands compared to the volume of initial silicon. Due to this volume expansion and reduction in the number of oxygen atoms depending on the length of the diffusion path, a newly formed silicon oxide layer is formed thinner as the distance from a sidewall of the gate structure increases. Consequently, when the thermal oxidation process is completed, a lower edge of the gate structure has a rounded shape as illustrated in FIG. 5.

According to the present exemplary embodiment, the thermal oxidation process is performed until the length of the diffusion path of the oxygen atoms becomes equal to a half of the width of the word lines WL. Therefore, the process time required for the thermal oxidation process may be controlled. In this case, as the width of the selection lines SSL and GSL is wider than that of the word lines WL, a central portion of the selection gate insulation layer 160SG is not oxidized. Consequently, the thickness of the central portion of the selection gate insulation layer 160SG is thinner than a thickness $t_1$ of a thinnest portion of the tunnel insulation layer 160T as illustrated in FIGS. 4B and 5. In other words, a half of a width $w_2$ of the selection lines SSL and GSL is greater than a distance $w_1$ from a position 99, at which a thickness of the selection gate insulation layer 160SG is equal to the thinnest thickness $t_1$ of the tunnel insulation layer 160T, to a sidewall of the selection lines SSL and GSL.

At this point, referring to FIGS. 4A and 4B, forming the low voltage gate electrode LVG and low voltage gate insulation layer 160LG in the low voltage transistor region LVTR may be performed using forming the selection lines SSL and GSL, and selection gate insulation layer 160SG in the selection transistor region STR. Accordingly, a half of the width $w_2$ of the low voltage gate electrode LVG is greater than the distance $w_1$ between a position 99 where the thickness of the low voltage gate insulation layer 160LG is equal to the thinnest thickness $t_1$ of the tunnel insulation layer 160T and a sidewall of the low voltage gate electrode LVG.

According to an exemplary the present invention, selection gate insulation layers are formed to be thinner than the tunnel insulation layer. Therefore, selection transistors of a NAND type flash memory device have improved turn-off current characteristics. Consequently, as an unselected cell string can be electrically isolated from bit lines and ground electrodes, program disturbance caused by boosting charge leakage can be minimized.

Also, according to an exemplary embodiment of the present invention, after a line width of selection lines is formed smaller than that of the word lines, the condition of a thermal oxidation process is controlled to form a thinner thickness for selection gate insulation layers than the thickness for the tunnel insulation layer. Consequently, a different thickness may be formed for each of the selection gate insulation layer and the tunnel insulation layer without performing an additional process. Furthermore, according to an exemplary embodiment of the present invention, a low voltage gate insulation layer can be formed using the process for forming the selection gate insulation layer. Therefore, a process of fabricating a low voltage transistor may be omitted. Consequently, it is possible to reduce manufacturing costs of a NAND type flash memory device according to exemplary embodiments of the present invention.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A NAND flash memory device comprising:
 a semiconductor substrate including a memory transistor region and a selection transistor region;
 word lines arranged in the memory transistor region of the semiconductor substrate;
 selection lines arranged in the selection transistor region of the semiconductor substrate;
 tunnel insulation layers interposed between the word lines and the semiconductor substrate; and
 selection gate insulation layers interposed between the selection lines and the semiconductor substrate and having a thinner thickness than a thickness of the tunnel insulation layers,
 wherein the selection gate insulation layer has a thinner thickness in their center region than in their edge portions.

2. The NAND flash memory device of claim 1, wherein the selection lines have a wider width than that of the word lines.

3. The NAND flash memory device of claim 1, wherein a width of the selection lines is at least twice a distance between a position where a thickness of the selection gate insulation layers is equal to a thinnest thickness of the tunnel insulation layers and a sidewall of the selection lines.

4. A NAND flash memory device comprising:
 a semiconductor substrate including a memory transistor region, a selection transistor region, and a low voltage transistor region;
 word lines arranged in the memory transistor region of the semiconductor substrate;
 selection lines arranged in the selection transistor region of the semiconductor substrate;
 low voltage gate electrodes arranged in the low voltage transistor region of the semiconductor substrate;
 tunnel insulation layers interposed between the word lines and the semiconductor substrates;
 selection gate insulation layers interposed between the selection lines and the semiconductor substrate, the selection gate insulation layers being thinner than the tunnel insulation layers; and
 low voltage gate insulation layers interposed between the low voltage gate electrodes and the semiconductor substrate,
 wherein the thickness of selection gate insulation layer is thinner in a center region thereof than in edge portions thereof.

5. The NAND flash memory device of claim 4, wherein the selection gate insulation layers has the same thickness as that of the low voltage gate insulation layers.

6. The NAND flash memory device of claim 4, wherein the width of word line is narrower than those of the selection lines and the low voltage gate electrodes.

7. The NAND flash memory device of claim 4, wherein a width of the selection lines is at least twice a distance between a position where a thickness of the selection gate insulation layers is equal to a thinnest thickness of the tunnel insulation layers and a sidewall of the selection lines; and
 a width of the low voltage gate electrodes is at least twice a distance between a position where a thickness of the low voltage gate insulation layer is equal to a thinnest thickness of the tunnel insulation layers and a sidewall of the low voltage gate electrodes.

8. The NAND flash memory device of claim 4, wherein the low voltage gate electrodes have the same thickness as that of the selection gate electrodes and are formed of the same material as that of the selection gate electrodes.

9. A method for fabricating a NAND flash memory device, the method comprising:
 forming a device isolation layer pattern in a semiconductor substrate to define active regions, the semiconductor substrate including a memory transistor region, a selection transistor region, and a low voltage transistor region;

forming a first insulation layer pattern on the active regions to cover the memory transistor region;

forming a second insulation layer on at least substantially an entire surface of the active regions where the first insulation layer pattern is formed; and forming word lines, selection lines and low voltage gate electrodes on the second insulation layer, wherein the word lines, the selection lines and the low voltage gate electrodes are located over the memory transistor region, the selection transistor region and the low voltage transistor region, respectively.

10. The method of claim 9, wherein the forming of the first insulation layer pattern comprises:

forming a first insulation layer on an entire surface of the active regions;

forming a mask pattern located on the first insulation layer at the memory transistor region;

etching the first insulation layer using the mask pattern as an etch mask to expose an upper surface of the active regions at the selection transistor region and low voltage transistor region; and removing the mask pattern.

11. The method of claim 10, wherein the mask pattern is a photoresist pattern formed using a photolithography process and a development process, and wherein the removing of the mask pattern is performed using a photoresist strip process.

12. The method of claim 9, wherein the forming of the second insulation layer is performed such that sum of thicknesses of the first insulation layer pattern and second insulation layer stacked over the memory transistor region is greater than a thickness of the second insulation layer stacked over the selection transistor region and the low voltage transistor region.

13. The method of claim 9, wherein the forming of the word lines comprises:

forming a first conductive layer on an entire surface of the semiconductor substrate where the second insulation layer is formed;

patterning the first conductive layer to form a first conductive pattern located on the active region at the memory transistor region;

forming a gate interlayer insulation layer and a second conductive layer on an entire surface of the semiconductor substrate where the first conductive pattern is formed; and patterning the second conductive layer, the gate interlayer insulation layer, and the first conductive pattern to form the word lines that cross the active regions.

14. A method for fabricating a NAND flash memory device, the method comprising:

forming a device isolation layer pattern in a semiconductor substrate to define active regions, the semiconductor substrate including a memory transistor region, a selection transistor region, and a low voltage transistor region;

forming a gate oxide layer having a first thickness on at least substantially an entire surface of the active regions;

forming word lines, selection lines and low voltage gate electrodes on the gate oxide layer, wherein the word lines, the selection lines and the low voltage gate electrodes are located over the memory transistor region, the selection transistor region and the low voltage transistor region, respectively; and performing a thermal oxidation process until the thickness of gate oxide layer becomes a second thickness under a central portion of the word lines, wherein the selection lines are formed with a wider width than a width of the word lines such that the gate oxide layer formed under a central portion of the selection lines has a thinner thickness than the second thickness during the thermal oxidation process.

15. The method of claim 14, wherein the low voltage gate electrodes are formed with a wider width than that of the word lines such that the gate oxide layer formed under a central portion of the low voltage gate electrodes has a thinner thickness than the second thickness during the thermal oxidation process.

16. The method of claim 14, wherein the performing of the thermal oxidation process is performed for a predetermined process time, such that the width of gate oxide layer, whose thickness increases during the thermal oxidation process, is formed smaller than a half of the width of selection line.

17. The method of claim 16, wherein the performing of the thermal oxidation process is performed for a predetermined time, such that the width of gate oxide layer, whose thickness increases during the thermal oxidation process, is formed smaller than a half of the width of low voltage gate electrode.

18. The method of claim 14, wherein the forming of the word lines comprises:

forming a first conductive layer on an entire surface of the semiconductor substrate where the gate oxide layer is formed;

patterning the first conductive layer to form a first conductive pattern located over the active regions at the memory transistor region;

forming a gate interlayer insulation layer and a second conductive layer on an entire surface of the semiconductor substrate where the first conductive pattern is formed; and patterning the second conductive layer, the gate interlayer insulation layer, and the first conductive pattern to form the word lines that cross the active regions.

19. The method of claim 18, wherein the selection lines and the word lines are formed simultaneously, wherein the forming of the selection lines comprises a step of etching at least one of the first conductive pattern, the gate interlayer insulation layer and the second conductive layer at the selection transistor region.

20. The method of claim 18, wherein the low voltage gate electrodes and the word lines are formed simultaneously, wherein the forming of the low voltage gate electrodes comprises a step of etching at least one of the first conductive pattern, the gate interlayer insulation layer and the second conductive layer at the low voltage transistor region.

* * * * *